(12) United States Patent
Marinis et al.

(10) Patent No.: US 7,851,970 B2
(45) Date of Patent: Dec. 14, 2010

(54) STRUCTURES FOR CRYSTAL PACKAGING INCLUDING FLEXIBLE MEMBRANES

(75) Inventors: Thomas F. Marinis, Haverhill, MA (US); Caroline A. Kondoleon, Andover, MA (US); Dariusz R. Pryputniewicz, Stoneham, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 1000 days.

(21) Appl. No.: 11/644,372

(22) Filed: Dec. 22, 2006

(65) Prior Publication Data

US 2008/0150397 A1 Jun. 26, 2008

(51) Int. Cl.
*H01L 41/08* (2006.01)
(52) U.S. Cl. ...................... 310/320; 310/348
(58) Field of Classification Search ................ 310/326, 310/346–348, 320, 324
See application file for complete search history.

(56) References Cited

U.S. PATENT DOCUMENTS

| | | | |
|---|---|---|---|
| 1,692,063 A | 11/1928 | Trogner | |
| 2,371,613 A | 3/1945 | Fair | |
| 2,470,609 A | 5/1949 | Elmore et al. | |
| 2,482,730 A | 9/1949 | Flynn | |
| 2,671,178 A | 3/1954 | Tomcik | |
| 3,339,091 A * | 8/1967 | Hammond et al. | 310/346 |
| 3,747,176 A * | 7/1973 | Toyoshima | 29/25.35 |
| 4,054,808 A * | 10/1977 | Tanaka | 310/323.21 |
| 4,450,376 A * | 5/1984 | Meitzler | 310/334 |
| 5,184,043 A * | 2/1993 | Yoshinaga | 310/320 |
| 5,714,917 A | 2/1998 | Ella et al. | |
| 5,767,612 A * | 6/1998 | Takeuchi et al. | 310/324 |
| 6,229,249 B1* | 5/2001 | Hatanaka et al. | 310/348 |
| 6,441,539 B1* | 8/2002 | Kitamura et al. | 310/346 |
| 6,584,660 B1* | 7/2003 | Shimogawa et al. | 29/25.35 |
| 7,154,212 B1* | 12/2006 | Kosinski | 310/348 |
| 7,414,349 B2* | 8/2008 | Sasaki | 310/324 |
| 2007/0222336 A1* | 9/2007 | Grannen et al. | 310/320 |
| 2008/0278731 A1* | 11/2008 | Majumdar et al. | 356/498 |
| 2009/0102322 A1 | 4/2009 | Akane et al. | |
| 2010/0026398 A1 | 2/2010 | Moriya et al. | |

FOREIGN PATENT DOCUMENTS

| | | | |
|---|---|---|---|
| FR | 2547458 A1 * | 12/1984 | |
| JP | 06006162 A * | 1/1994 | |
| JP | 09129941 A * | 5/1997 | |
| JP | 2004140397 A * | 5/2004 | |
| SU | 961101 A1 | 9/1982 | |

OTHER PUBLICATIONS

International Search Report and Written Opinion of PCT/US2007/026259, 13 pages, (date: May 20, 2008).

* cited by examiner

*Primary Examiner*—J. SanMartin
(74) *Attorney, Agent, or Firm*—Goodwin Procter LLP

(57) ABSTRACT

A crystal oscillator is mounted in a flexible harness rather than at discrete points. The crystal oscillator and associated control circuitry may be formed on a common substrate, decreasing component size and minimizing temperature fluctuations by shortening the thermal path between the crystal and the control circuitry.

21 Claims, 4 Drawing Sheets

STRUCTURES FOR CRYSTAL PACKAGING INCLUDING FLEXIBLE MEMBRANES

FIELD OF THE INVENTION

This invention relates generally to sensor packaging, and in particular to packaging for crystal-based devices.

BACKGROUND

As the use of navigation systems increases in both the public and military sectors, there is an incentive to improve the robustness and decrease the size of their individual components. One such component is the crystal oscillator, which supplies a stable clock frequency derived from the mechanical resonance of a piezoelectric crystal. Crystal oscillators can also be found in products such as test equipment, watches, and electronic circuits. Variants of the crystal oscillator engineered to reduce the impact of environmental factors such as temperature and humidity include the temperature-controlled (or -compensated) crystal oscillator (TCXO), the microcomputer-compensated crystal oscillator (MCXO) and the oven-controlled crystal oscillator (OCXO).

A TCXO typically includes a control chip electrically connected to the piezoelectric crystal oscillator. Traditionally, the control chip and the crystal are packaged in separate carriers which are then bonded together. The crystal is attached to its carrier with epoxy, and electrical connections are made between the two carriers. For example, the two carriers may be positioned one atop the other and soldered together. In some constructions, one end of the crystal is mounted inside its carrier using two small bumps of conductive epoxy. The two bumps provide both the support and electrical contacts for the crystal.

This scheme exposes the crystal to local stresses at the attachment point that can deleteriously affect its performance and reliability. For example, considerable stress may occur when the package is subjected to an inertial load or a harsh environment. If the elastic limits of the structure (or portions thereof) are exceeded, a permanent change in the TCXO frequency can occur.

Furthermore, the use of multiple carriers for a single oscillator package constrains its minimum size and can affect the performance of the oscillator as a function of temperature. For example, in the stacked packaging scheme discussed above, the thermal path between the crystal and its control chip is large, since it traverses both carriers. As a result, potentially harmful temperature fluctuations are more likely.

Finally, discrete packaging of the crystal and control components results in a large overall volume that can limit deployment.

SUMMARY

The foregoing limitations of conventional packaging schemes are herein addressed by mounting the crystal oscillator in a flexible harness rather than at discrete points. Moreover, the crystal oscillator and control circuitry may be formed on a common substrate, decreasing component size and minimizing temperature fluctuations by shortening the thermal path between the crystal and the control circuitry.

In accordance with the invention, a crystal oscillator is mounted within a harness made of a flexible dielectric material. Advantages of this approach include isolation of shock within the harness rather than allowing it to be transmitted to the crystal; protection against stress; improved thermal isolation of the crystal; and reduction in the signal and thermal path length between the crystal and its control chip.

The crystal may be attached to the harness using, for example, indium solder or conductive epoxy, which can also establish electrical connections. In some embodiments, the dielectric film is the KAPTON polyimide film supplied by E.I. du Pont de Nemours Co., Wilmington, Del. In other embodiments, the dielectric film may include, or consist essentially of, at least one of Teflon, liquid crystal polymer, polyester, or polyvinyl chloride. The harness may be sputtered with metal and photo-patterned to create electrical connections.

In an aspect, the invention features a structure including a piezoelectric crystal disposed over at least a first portion of a flexible membrane. The crystal may be in contact with a least two spaced-apart regions of the flexible membrane, and a second portion of the flexible membrane may be disposed over and harness the crystal against the spaced-apart regions. In an embodiment, a conductive adhesive adheres the crystal to at least the first portion of the membrane. The conductive adhesive may be indium solder and/or conductive epoxy.

Embodiments of the invention may include the following features. At least one metal film may be disposed over and in contact with the flexible membrane, and may be in contact with the crystal. The metal film may include at least one of aluminum or gold. The flexible membrane may be attached to a first surface of a substrate, and may be attached by at least one of solder bumps or gold rivets. The membrane may be disposed in a cavity in the substrate, and a thin foil may be disposed over the cavity and seal it. Control circuitry may be disposed on a second surface of the substrate, and at least one conductive via may connect the control circuitry to the crystal. The first surface of the substrate may be substantially parallel to and opposite the second surface, and at least a portion of the conductive via may be disposed within the substrate. The control circuitry may be configured to provide a temperature-dependent correction voltage. The flexible membrane may include a dielectric material such as a polyimide, Teflon, liquid crystal polymer, polyester, or polyvinyl chloride.

In another aspect, the invention features a method of making a crystal oscillator including providing a substrate with a first surface, disposing a piezoelectric crystal over at least a portion of a flexible membrane, disposing the membrane and crystal over the first substrate surface, and disposing control circuitry over a second surface of the substrate. An electrical connection may be formed between the crystal and the control circuitry. The first surface of the substrate may be substantially parallel to and opposite the second surface, and forming the electrical connection may including forming at least one conductive via through the substrate. In an embodiment, the method includes forming a cavity in the substrate, and the first surface may be at least partially within the cavity. The crystal may be placed in contact with at least two spaced-apart regions of the flexible membrane. A second portion of the flexible membrane maybe be disposed over the crystal so as to harness the crystal against the spaced-apart regions of the flexible membrane.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

In the following description, various embodiments of the present invention are described with reference to the following drawings, in which.

DETAILED DESCRIPTION

Figure 1:
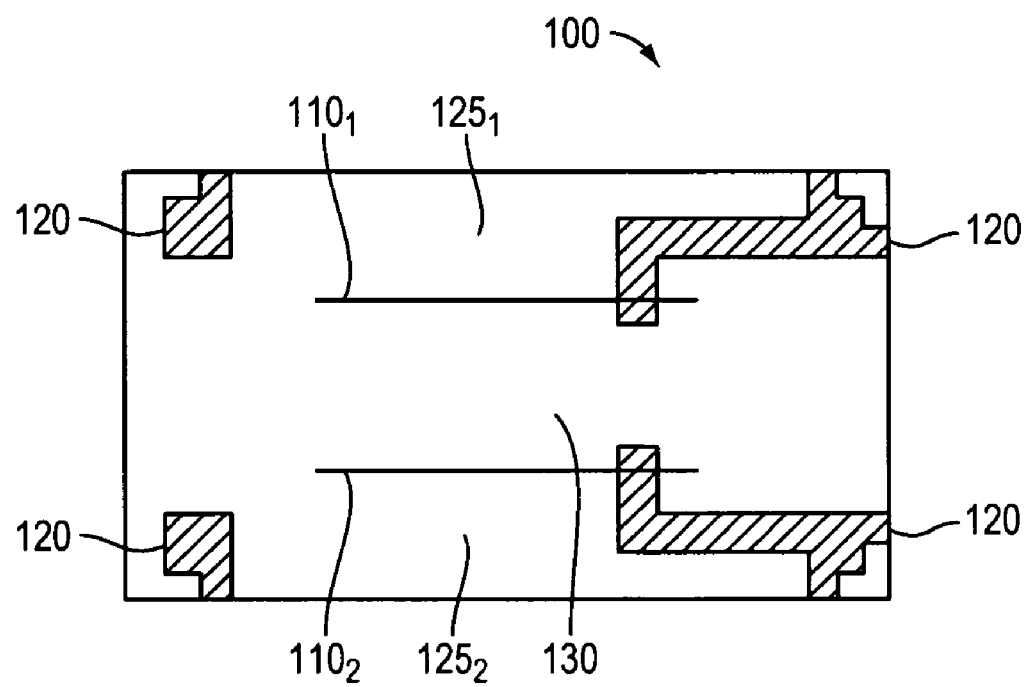
FIG. 1 is a plan view of a flexible membrane for supporting a crystal in accordance with the invention.

Referring to FIG. 1, a flexible membrane may be prepared for utilization as a harness for a piezoelectric crystal. Membrane 100 includes, or consists essentially of, a flexible material, which may be a dielectric material (i.e., an electrically insulating material). For example, membrane 100 may be a polyimide film such as the KAPTON polyimide film supplied by E.I. du Pont de Nemours Co., Wilmington, Del. In other embodiments, membrane 100 includes, or consists essentially of, at least one of Teflon, liquid crystal polymer, polyester, or polyvinyl chloride. Membrane 100 may be approximately rectangular, and may have areal dimensions of approximately 6 millimeters (mm) by approximately 3 mm In other embodiments, membrane 100 may take any shape suitable to the application, e.g., a square, quadrilateral, other polygon, or even a circle. The thickness of membrane 100 may be approximately 12 to 25 micrometers. Generally, the shape, areal size, and thickness of membrane 100 will be large enough to accommodate a piezoelectric crystal (as described below). Preferably, membrane 100 is sized to be as small as possible while still accommodating a given piezoelectric crystal.

Membrane 100 may include one or more slits representatively illustrated at $110_1$, $110_2$ as well as two or more contacts $120_1$, $120_2$. Slits 110 may be cuts made through substantially the entire thickness of membrane 100, and may roughly divide membrane 100 into two or more portions. A first portion of membrane 100, representatively illustrated at $125_1$, $125_2$, may be defined as the peripheral region(s) between slits 110 and the outer boundaries of membrane 100. A second portion 130 of membrane 100 may be defined as the region between the two outermost slits 110. Contacts 120 may include, or consist essentially of an electrically conductive material, preferably a metal such as aluminum or gold. Contacts 120 may cross at least one of slits 110 in order to facilitate electrical contact with a subsequently mounted piezoelectric crystal.

Figure 2:
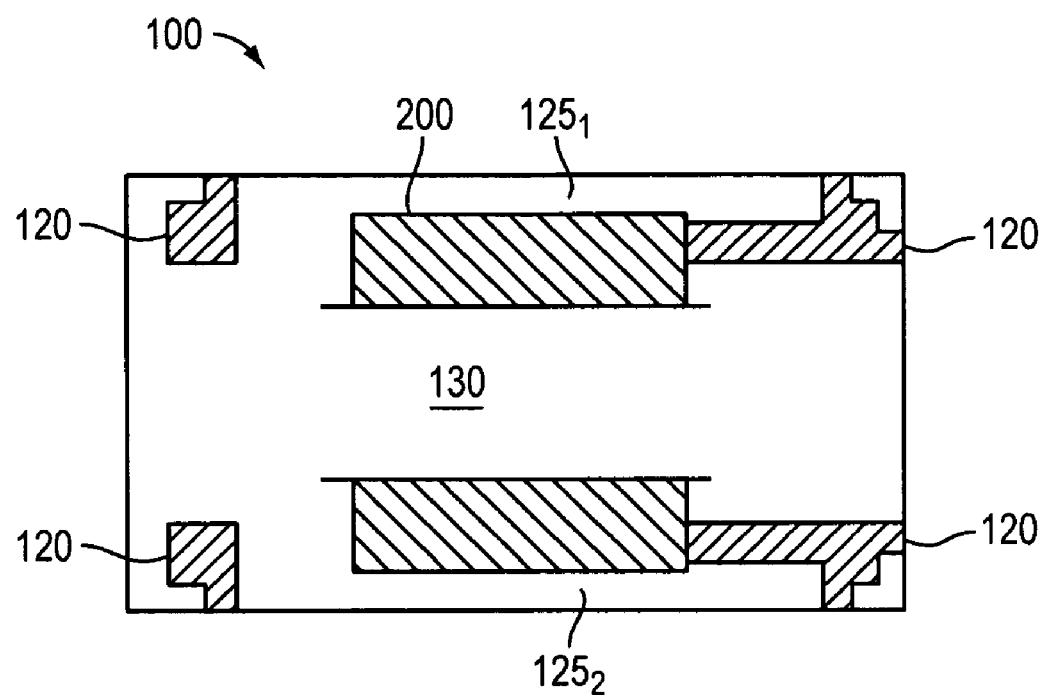
FIG. 2 shows the flexible membrane illustrated in FIG. 1 with a crystal mounted thereon.

Referring to FIG. 2, crystal 200 may be configured so that it will be in contact with first portion 125 at a plurality of points, or even in contact with membrane 100 across the entire area of overlap of crystal 200 and first portion 125. In an embodiment, crystal 200 is wider than membrane region 130, such that when the crystal is slipped through slits 110, portions of the crystal 200 extend to each side of membrane region 130 to overlap the membrane regions $125_1$, $125_2$. As a result, membrane region 130 secures the crystal 200 against regions 125 in the manner of a harness. Crystal 200 may include, or consist essentially of, a piezoelectric material such as man-made or natural quartz. The size and dimensions of membrane 100 are selected such that membrane 100 has a larger cross-sectional area than crystal 200. For example, crystal 200 may be approximately rectangle-shaped, and may have areal dimensions of approximately 3 mm by approximately 1.5 mm. The thickness of crystal 200 may be approximately 0.08 mm.

An adhesive material may be used in order to maintain contact between crystal 200 and membrane 100 (i.e., to prevent crystal 200 from slipping out of the harness provided by membrane region 130 during operation). The adhesive material may be placed at one or more of the points of contact between crystal 200 and membrane 100. When placed on or within membrane 100, crystal 200 may overlap at least one of the contacts 120. In order to facilitate electrical contact between crystal 200 and contacts 120, the adhesive material may be conductive, e.g., may be indium (In) solder or conductive epoxy. Electrical contact between crystal 200 and membrane 100 may exert less deleterious stress upon crystal 200 than connections between a crystal and a rigid package due to the flexibility of membrane 100.

Figure 3:
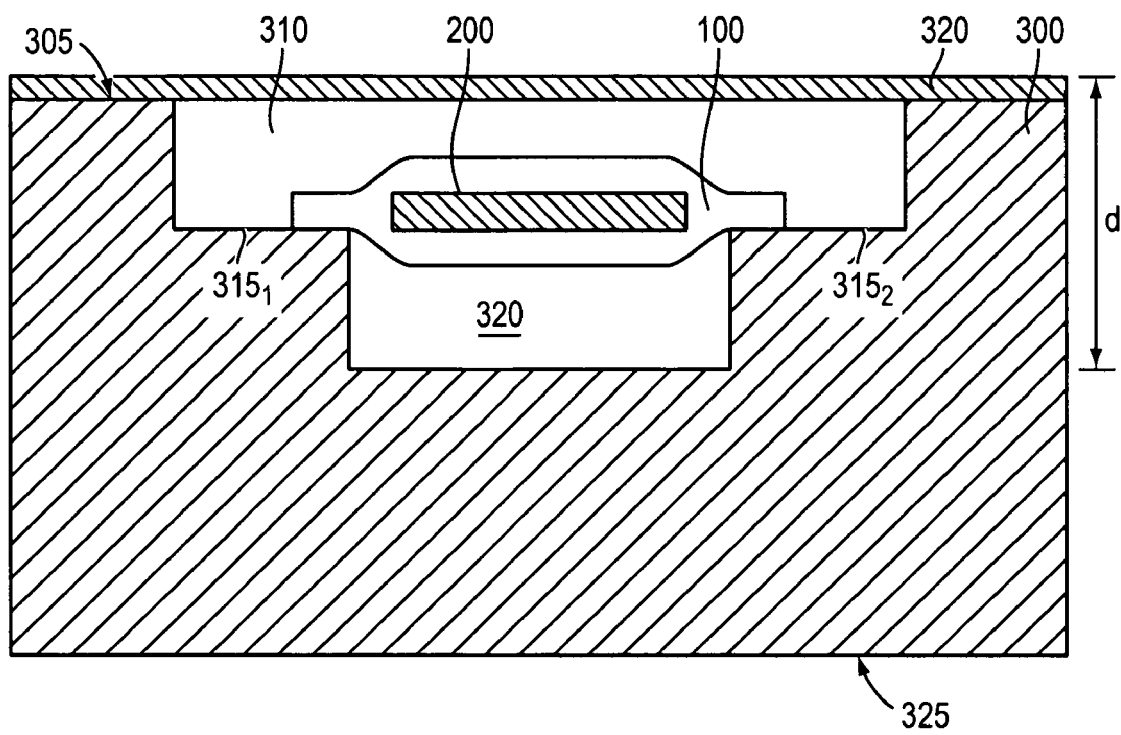
FIG. 3 is a cross-sectional view of a substrate, mounted in a flexible membrane as shown in FIG. 2, attached to a substrate.

FIG. 3 shows how membrane 100 (with crystal 200 therein) may be attached to a substrate 300. The material and structure of substrate 300 is dictated by the desired application. For example, substrate 300 may have a thickness of approximately 0.5 mm, and may include, or consist essentially of, a rigid material such as alumina, silicon, quartz, or liquid crystal polymer. Membrane 100 may be attached to a surface 305 of substrate 300 at the ends of membrane 100, and the points of connection may substantially overlap with the locations of contacts 120. Membrane 100 may be attached to substrate 300 using, e.g., gold rivets or solder including or consisting essentially of In or an indium-tin alloy, and may be substantially parallel to surface 305. In an embodiment, surface 305 follows a stepped cavity 310 milled into substrate 300, and membrane 100 is attached to opposing steps $315_1$, $315_2$ of cavity 310 so as to remain suspended above the recess 320. Cavity 310 may have a total depth d of, for example, approximately 0.125 mm. Cavity 310 may be at least substantially sealed by a foil cover 320, which is bonded to substrate 300 by, e.g., an adhesive material or solder. Foil 320 may be relatively thin, i.e., it may have a thickness of approximately 0.05 mm. Placing membrane 100 within sealed cavity 310 may insulate membrane 100 and crystal 200 from the ambient environment during subsequent operation.

Figure 4:
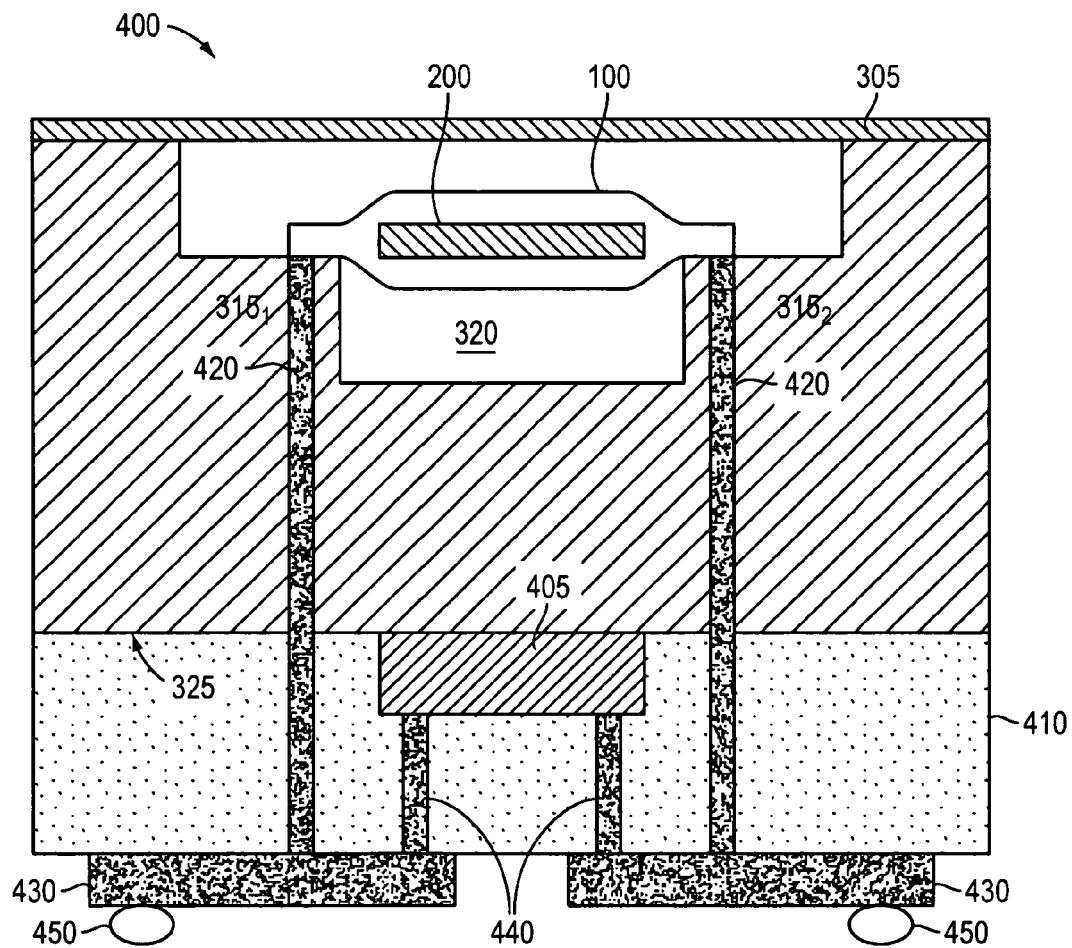
FIG. 4 is a cross-sectional view of a crystal oscillator-based device incorporating the elements shown in FIG. 3.

With continued reference to FIG. 3, and also to FIG. 4, a block of control circuitry 405 may be formed on a second surface 325 of substrate 300. Second surface 325 may be substantially parallel to and opposite first surface 305. Control circuitry 405 may include a plurality of passive and active electronic devices, such as transistors, varactors, and/or thermistors, and may be fabricated in whole or in part directly on substrate 300 or bonded to a face thereof as a complete, pre-fabricated chip. Control circuitry 405 may include, for example, a conventional compensation module that provides a temperature-dependent correction voltage. Control circuitry 405 may be enclosed within the thickness of a dielectric film 410 disposed over second surface 325, thus protecting control circuitry 405 from environmental factors during operation. Electrical contact between membrane 100 and control circuitry 405 is established by the formation of at least one conductive via 420 (there may be a plurality of vias 420, two of which are representatively illustrated). Vias 420 are formed by etching through at least substrate 300 (and, if appropriate, through dielectric film 410 as well) and refilling the resulting void with a metal such as gold or copper. Vias 420 may directly connect membrane 100 to control circuitry 405, or may instead connect, via a metal film 430, to one or more vias 440 formed from control circuitry 405 through dielectric film 410. The resulting device 400, formed by the interconnection of membrane 100 (with crystal 200) and control circuitry 405, may be subsequently electrically connected to other devices or circuits by one or more conductive input/output connections 450.

Device 400, with crystal 200 harnessed within membrane 100 and electrically connected to control circuitry 405, may be utilized in a wide range of applications. Device 400 may, for example, be configured to generate a high-frequency (e.g., approximately 20 GHz) clock signal, and may be utilized as a TCXO, MCXO, or OCXO in accordance with designs well known in the art. Device 400 may be utilized in test equipment or global positioning system (GPS) applications or other navigational systems.

The invention may be embodied in other specific forms without departing from the spirit or essential characteristics thereof. The foregoing embodiments are therefore to be considered in all respects illustrative rather than limiting on the invention described herein.

What is claimed is:

1. A structure comprising:
   a piezoelectric crystal; and
   a flexible membrane comprising (i) a first portion including at least two spaced-apart regions and (ii) a second portion,
   wherein the crystal is disposed over the at least two spaced-apart regions, and the second portion of the flexible membrane is disposed over and harnesses the crystal against the at least two spaced-apart regions.

2. The structure of claim 1, further comprising a conductive adhesive adhering the crystal to the flexible membrane.

3. The structure of claim 2, wherein the conductive adhesive comprises at least one of indium solder or conductive epoxy.

4. The structure of claim 1, further comprising at least one metal film disposed over and in contact with the flexible membrane.

5. The structure of claim 4, wherein the metal film is in contact with the crystal.

6. The structure of claim 4, wherein the metal film comprises at least one of aluminum or gold.

7. The structure of claim 1, further comprising a substrate having a first surface, the flexible membrane being attached to the first surface of the substrate.

8. The structure of claim 7, wherein the flexible membrane is attached to the first surface of the substrate by at least one of solder bumps or gold rivets.

9. The structure of claim 7, wherein the substrate comprises a cavity, the flexible membrane being disposed in the substrate cavity.

10. The structure of claim 9 further comprising a thin foil disposed over and sealing the flexible membrane within the cavity.

11. The structure of claim 7, further comprising:
    control circuitry on a second surface of the substrate; and
    at least one conductive via connecting the control circuitry to the crystal.

12. The structure of claim 11, wherein the first surface of the substrate is substantially parallel to and opposite the second surface of the substrate, and at least a portion of the at least one conductive via is disposed within the substrate.

13. The structure of claim 11, wherein the control circuitry is configured to provide a temperature-dependent correction voltage.

14. The structure of claim 7, wherein the flexible membrane and the substrate comprise different materials.

15. The structure of claim 1, wherein the flexible membrane comprises a dielectric material.

16. The structure of claim 15, wherein the flexible membrane comprises a polyimide.

17. The structure of claim 15, wherein the flexible membrane comprises at least one of Teflon, liquid crystal polymer, polyester, or polyvinyl chloride.

18. The structure of claim 1, wherein the flexible membrane comprises at least one slit and the crystal passes through the at least one slit.

19. The structure of claim 1, wherein the crystal is in contact with the at least two spaced-apart regions and the second portion of the flexible membrane.

20. The structure of claim 1, further comprising a plurality of discrete electrical contacts disposed between the crystal and the spaced-apart regions of the flexible membrane.

21. The structure of claim 1, wherein the flexible membrane isolates the crystal from vibration.

\* \* \* \* \*